United States Patent [19]
DeLuca et al.

[11] Patent Number: 5,489,573
[45] Date of Patent: Feb. 6, 1996

[54] THALLIUM-CALCIUM-BARIUM-COPPER-OXIDE SUPERCONDUCTOR WITH SILVER AND METHOD

[75] Inventors: John A. DeLuca, Burnt Hills, N.Y.; Pamela L. Karas, Westerville, Ohio

[73] Assignee: General Electric Company, Schenectady, N.Y.

[21] Appl. No.: 291,214

[22] Filed: Aug. 16, 1994

Related U.S. Application Data

[63] Continuation-in-part of Ser. No. 143,039, Oct. 29, 1993, abandoned, which is a continuation of Ser. No. 841,175, Feb. 25, 1992, abandoned.

[51] Int. Cl.$^6$ ................................ B32B 9/00; B05D 5/12
[52] U.S. Cl. ...................... 505/238; 505/470; 505/501; 505/737; 505/742; 505/120; 427/62; 427/343; 428/930
[58] Field of Search .................................. 505/470, 501, 505/737, 742, 238, 120; 427/62, 63, 343; 428/930

[56] References Cited

U.S. PATENT DOCUMENTS

| 4,870,052 | 9/1989 | Engler et al. |
| 4,997,811 | 3/1991 | Hermann et al. ........................... 505/1 |
| 5,073,536 | 12/1991 | Sheng et al. |

OTHER PUBLICATIONS

T Kumagai, et al., Preparation of Superconducting Ba2YCu3O7-y/Ag Composite Films by the Dipping–Pyrolysis Process Using Metal Naphthenates at 750 degrees C, Japanese Journal of Alpplied Physics, vol. 30, No. 7B, Jul. 1991, (pp. 1268–1270).

J. P. Singh et al., Effect of Silver and Silver Oxice Additions on the Mechanical and Superconducting Properties of YBa2Cu3O7-8 Superconductors, J. Appl. Phys. 66(7), Oct. 1, 1989, American Institute of Physics (pp. 3154–3159).

J. Jung et al., Flux Motion, Proximity Effect, and Critical Current Density in YBa2Cu2O7-8/Silver Composites, Physical Review B, vol. 42, No. 10, The American Physical Society, Oct. 1, 1990 (pp. 6181–6195).

G. G. Peterson, et al., Improvement of Polycrystalline Y–Ba–Cu–O by the Addition of Silver, J. Mater. Res. 3(4) Jul./Aug. 1988, Materials Research Society, (pp. 605–609).

B. Dwir et al., Evidence of Enhancement of Critical Current by Integrain Ag in YBaCuO–Ag Ceramics, Appl. Phys. Lett. 55(4), Jul. 24, 1989, American Institute of Physics, (pp. 399–401).

K. Jyodoi, et al., Doping Effects of Metallic Elements on the Superconductivity in the Tl–Ba–Ca–Cu–O System, Japanese Journal of Applied Physics, vol. 30, No. 12A, Dec. 1991 (pp. 2021–2024).

P. N. Peterts et al., Observation of Enhanced Properties in Samples of Silver Oxide Doped YBa2Cu3Ox, Appl. Phys. Lett. 52 (24) Jun. 13, 1988, American Institute of Physics (pp. 2066–2067).

F. Deslandes et al., Research of the Effective Role of Silver Additions to Yba2Cu3O7, Solid State Communications, vol. 71, No. 5, 1989 (pp. 407–410).

Wei Gao and J. B. VanderSande, The Reactions of Bi(Pb–Sr–Ca–Cu–O–Ag Superconducting Microcomposites Placed in Contact with Silver, Gold, Palladium, Nickel, Copper and Platinum Substrates, Materials Science & Engrg. B10, 1990 (pp. 247–255).

(List continued on next page.)

Primary Examiner—Roy V. King
Attorney, Agent, or Firm—William H. Pittman

[57] ABSTRACT

A method is disclosed for forming polycrystalline thallium system superconductors having high current carrying capacity and high magnetic field behavior. A precursor deposit is formed comprised of silver, in an amount of about 1 to 20 mole percent of total metals in the precursor deposit, and the balance oxides of calcium, barium, and copper in ratios for forming the superconductor. The precursor deposit is annealed in an oxidizing atmosphere, and in the presence of a source of thallous oxide. The source of thallous oxide is heated to a first temperature selected to incorporate thallium into the deposit in an amount of about 6 to 22 mole percent of metals in the superconductor, and the precursor deposit is heated to a second temperature to form the superconductor.

6 Claims, 4 Drawing Sheets

Hiroyuki Nasu et al., The Influences of Ag Addition on Superconducting Properties and Tensile Strength for Bi–Sr–Ca–Cu–O Fibers Prepared by Pyrolysis of Organic Acid Salts, Japanese Journal of Applied Physics, vol. 29, No. 10, Oct. 1990 (pp. 1819–1822).

T. E. Os'kina et al. Preparation of Bi–Pb–Sr–Ca–Cu–O Superconducting Thick Films on Metal Substrates of Au, Ag and Ni, Supercond Sci Technol. 4, 1991 (pp. 301–305).

Chan Joong Kim et al., Effects of Ag/Ag2O Doping on the Superconductivity of the Bi1.84–Pb0.34–Sr1.91–Ca2.03–Cu3.06–Oy Oxide, Materials Letters, vol. 11, No. 3,4, May 1991 (pp. 79–84).

Hammond et al, Appl. Phys. lett. 57(8) Aug. 1990, pp. 825–827.

Kawai et al, Jpn. J. Appl. Phys. 26(10) Oct. 1987, pp. L1740–L1742.

Tang et al, Supercond. Sci. Technol. 5 (1992) pp. 538–541.

Qi et al, Physica C 176 (1991) pp. 38–42.

Politis et al, Modern Physics letters B. vol. 2, No. 9 (1988) pp. 1119–1123.

Richeson et al, Appl. Phys. lett. 54(21) May 1989, pp. 2154–2156.

Lin et al, Jpn. J. Appl. Phys. 28(1) Jan. 1989 pp. L85–L87.

THALLIUM-CALCIUM-BARIUM-COPPER-OXIDE SUPERCONDUCTOR WITH SILVER AND METHOD

This application is a Continuation-In-Part of Ser. No. 08/143,039, filed Oct. 29, 1993, which is a Continuation of Ser. No. 07/841,175, filed Feb. 25, 1992 both now abandoned.

This invention relates to a ceramic thallium oxide superconductor compositions, ceramic thallium oxide superconductor articles, and a method for forming the thallium system superconductor compositions and to devices and articles having improved current carrying properties at elevated temperatures and in the presence of magnetic fields. More specifically, it relates to the thallium-calcium-barium-copper oxide system of oxide superconductors, sometimes herein referred to as the thallium system superconductors. More specifically, the invention relates to the 1223 phase of the thallium-calcium-barium-copper oxide system of oxide superconductors and to textured films of the thallium system superconductors, particularly 1223 phase films.

BACKGROUND OF THE INVENTION

Thallium system compositions and phases and methods of preparation are well documented in the literature. Thallium system superconductor compositions and a method of preparation were reported in "Bulk Superconductivity at 120 K in the Tl-Ca/Ba-Cu-O System," Z. Z. Sheng and A. M. Hermann, Nature Vol. 332, Mar. 10, 1988, pp. 138–139. Briefly described, appropriate amounts of powdered $Tl_2O_3$, CaO and $BaCu_3O_4$ to form a desired composition were completely mixed, ground and pressed into pellets. A tube furnace was heated to 880° to 910° C., and the pellets were placed in the furnace for three to five minutes with a flowing oxygen atmosphere. The pellets were removed from the furnace after heating, and quenched to room temperature in air, or furnace cooled to room temperature. The pellets were reaction sintered by the heat treatment, forming a superconducting oxide compound. Some quenched samples were subsequently annealed at 450° C. in flowing oxygen for several hours.

An interesting feature of the thallium oxide superconductors, as well as a variety of other oxide superconductors, is that they are nonstoichiometric with respect to oxygen content. The oxygen content may vary. Though oxygen can vary over a small range, the variations can have an effect on the superconducting behavior of the compound. A convenient way of showing the composition of the oxide superconductors is by a formula showing the atomic ratio of each element, e.g., $Tl_2Ca_2Ba_2Cu_3O_{10+y}$ where y is a fraction of 1.

A number of the oxide compound compositions for the thallium system superconductors were reported in "Chemical Engineering and the Development of Hot Superconductors," R. Kumar, Chemical Engineering Progress, April 1990 pp. 17–27, and are shown by atomic ratio in Table 1 below. The critical temperature, $T_c$, is shown for each composition.

TABLE I

Composition of Thallium System Superconductors by Atomic Ratio

| Tl | Pb | Ca | Sr | Ba | Cu | O | $T_c$ |
|---|---|---|---|---|---|---|---|
| 2 | — | — | — | 2 | 1 | 6 + y | 80 |
| 2 | — | 1 | — | 2 | 2 | 8 + y | 108 |
| 2 | — | 2 | — | 2 | 3 | 10 + y | 125 |
| 2 | — | 2 | — | 3 | 4 | 12 + y | 104 |
| 1 | — | 1 | — | 2 | 2 | 7 + y | 80 |
| 1 | — | 2 | — | 2 | 3 | 9 + y | 122 |
| 1 | — | 2 | — | 3 | 4 | 11 + y | 120 |
| 0.5 | 0.5 | 1 | 2 | — | 2 | 7 + y | 90 |
| 0.5 | 0.5 | 2 | 2 | — | 3 | 9 + y | 122 |
| 1 | — | — | 1 | — | 1 | 5 + y | 40 |
| 1 | — | 0.5 | 2 | — | 2 | 7 + y | 90 |

Since the time of the original disclosure of powder formed bulk thallium system superconducting compounds, thin films have been made by sequential thermal evaporation, and sequential electron beam evaporation. Both the sintered ceramic pellets and the thin films were treated by heating in flowing air or oxygen at temperatures of about 800° to 900° C. to form the superconducting compositions. However, thallium oxide has an appreciable vapor pressure at the temperatures required to form the superconductors. As a result, thallium can be vaporized during the 800° to 900° C. annealing treatments leading to loss of thallium from the superconductor.

In "Superconducting Thin Films of $Tl_2Ca_2Ba_2Cu_3O_y$ and $Tl_2CaBa_2Cu_2O_y$," D. S. Ginley et al., Physica C 156, 1988, pp. 592–598, incorporated herein by reference, it was reported that thin films of the thallium system were annealed in the presence of thallium metal to suppress thallium loss from the superconductor. This method was found to be an unreproducible technique for forming the superconducting compositions. In another method, thin films were annealed while sandwiched between pellets of the thallium system superconductor consolidated from powders with the correct stoichiometry for the composition desired in the thin film. Thus, if a film of the superconducting composition $Tl_2Ca_2Ba_2Cu_3O_{10+y}$ was being produced, the bulk ceramic pellet composition was prepared to be $Tl_2Ca_2Ba_2Cu_3O_{10+y}$.

A strong correlation was found between film quality and annealing the film in the presence of the bulk ceramic of the desired composition. Films having a thallium content slightly greater than the stoichiometric composition had improved current carrying capacity, while those that were thallium deficient had a lower current carrying capacity. High current carrying capacity in polycrystalline oxide superconductors is believed to be associated with strongly interconnected or linked grains in the polycrystalline material, and low current carrying capacity is believed to be associated with poorly connected or weak linked grains. The individual crystals in polycrystalline superconductors are sometimes herein referred to as grains.

The high transition temperatures of the thallium system superconductors makes commercial use in devices such as motors, magnets, and power generation and transmission equipment operating at liquid nitrogen temperature and above possible. However, to be of practical value a ceramic superconductor must be able to carry or conduct a substantial current, at least approaching the current carrying capacity of alloy superconductors such as $Nb_3Sn$. The high current carrying capacity must be evident at temperatures up to the critical temperature without quenching or loss of superconductivity as evidenced by a substantial increase in electrical resistance.

In some applications the high current carrying capacity must also be evident in the presence of magnetic fields. It is known that current carrying capacity can be greatly diminished in the presence of a magnetic field, so that the superconductor decreases in current carrying capacity as magnetic field increases up to a critical magnetic field above which the superconductor is quenched. A superconductor having high magnetic field behavior is characterized by a low reduction in current carrying capacity when the superconductor is in the presence of a magnetic field.

Another requirement for commercial application of ceramic superconductors is the development of reproducible and efficient methods for the fabrication of polycrystalline forms, particularly films of the thallium system compositions and most particularly films of the 1223 phase.

An object of this invention is a method of forming polycrystalline thallium system superconductors having improved current carrying capacity at operating temperatures and in magnetic fields.

Another object of this invention is to provide a method for making improved polycrystalline thallium system superconductor films by incorporating a small amount of silver in the precursor oxide film prior to the thallium-incorporating reaction which forms the thallium containing superconductor phase.

BRIEF DESCRIPTION OF THE INVENTION

A polycrystalline 1223 phase thallium system superconductor composition in the form of a textured film is formed from a mixture of calcium, barium, and copper oxides in the presence of an effective amount of silver metal. The term "effective amount" means an amount of silver metal which is sufficient to cause the liquid phase transformations necessary to form the 1223 superconductor phase. The term "textured" as used herein with respect to the superconductor film refers to the microstructure of the film relative to the substrate. Substantially, all of the crystallites are aligned with the C-axis perpendicular to the surface of the substrate. It has been determined that textured films are characterized by higher critical current densities than films with more random microstructure.

The mixed oxide precursor composition generally comprises silver in effective amounts ranging from about 1 to 20 mole percent based on the mole amounts of the calcium, barium, and copper in the precursor admixture. The balance of the cations in the admixture are the calcium, barium, and copper in ratios for forming the superconductor. The silver-containing precursor composition of oxides is then heated in an oxidizing atmosphere, saturated with thallium(ous) oxide supplied from a supply of thallic oxide. As used herein, the term "oxidizing atmosphere" means an atmosphere comprising oxygen and up to 80 percent of inert gas such as nitrogen or argon. However, it is preferable that the oxidizing atmosphere be substantially pure oxygen.

The source of thallium is heated to a first temperature sufficient to incorporate thallium into the precursor oxide admixture in an amount of about 6 to 22 mole percent of total metals in the superconductor. The precursor deposit is heated to a second temperature to form the superconductor as more precisely described in the following examples.

Subsequently, the superconductor can be further annealed in an oxidizing atmosphere at about 500° C. to 650° C. to stabilize the current carrying capacity in the superconductor.

The following description of the invention will be better understood by reference to the following Figures.

DETAILED DESCRIPTION OF THE INVENTION

Figure 1:
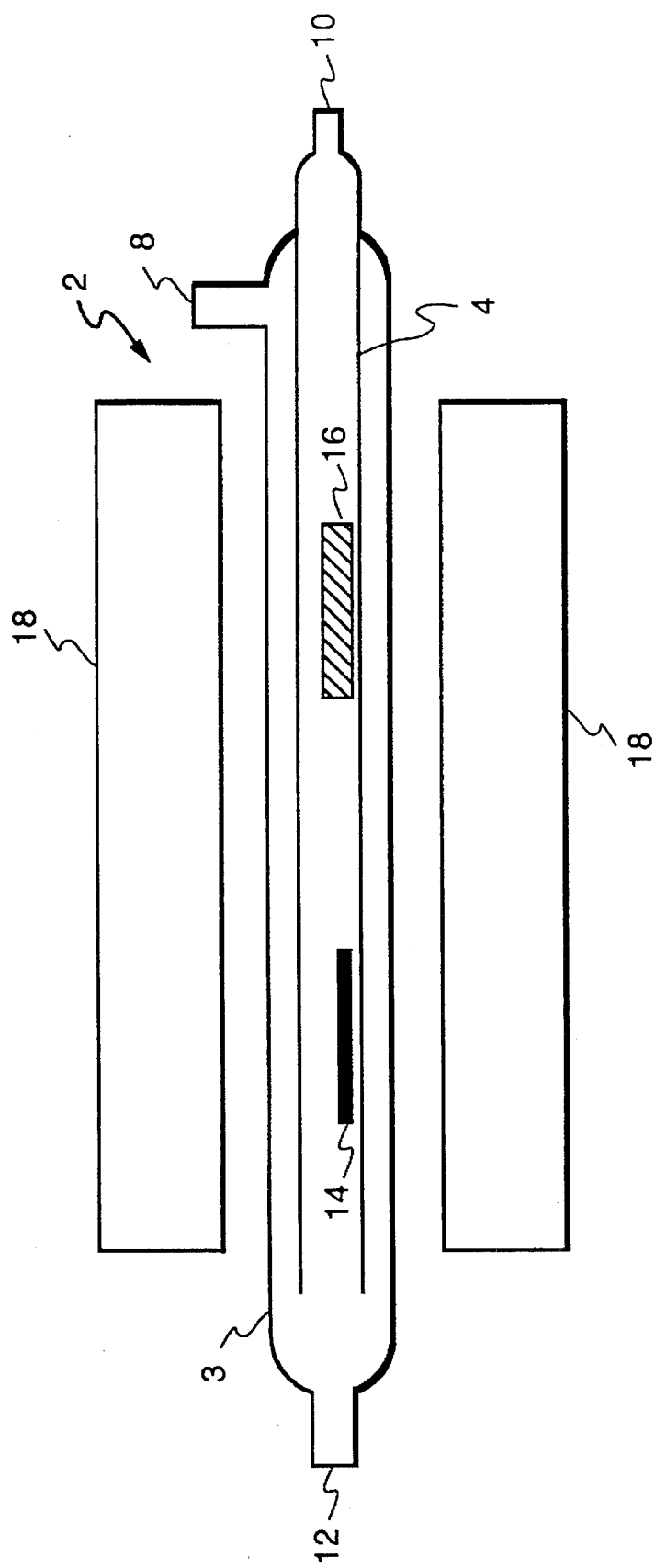
FIG. 1 is a schematic diagram of a two zone flow reactor suitable for making the superconductor films described herein.

The process of this invention includes the steps of reacting a film of barium, calcium, and copper oxides with thallium oxide vapors in an oxidizing atmosphere in the presence of an effective amount of silver metal.

The polycrystalline thallium system superconductors formed by the method of this invention have improved current carrying capacity and improved high magnetic field behavior. We have found that such improved thallium system superconductors can be formed by providing from about 1 to 20 mole percent silver metal in the precursor oxide film during the thallium reaction and formation of the thallium superconductor phase. The amount of silver required is calculated as a mole percent based on the total moles of cation present, except thallium. In experiments, it was found that preferably from about 2 to about 12 mole percent silver was sufficient to effectively form the superconductor phase. It is believed that the silver facilitates or mediates the formation of a liquid oxide phase from which the superconductor phase, e.g., the 1223 composition, precipitates. Based on scanning electron microscopy, the silver appears to be distributed throughout the oxide film in the form of small nodules which, although evenly distributed throughout the film, do not constitute a homogeneous composition on an atomic level. The presence of the silver in the precursor oxide admixture, combined with incorporation of thallium during sintering, provides strong current links between grains.

The precursor deposit comprised of silver and a mixture of oxides of calcium, barium, and copper in a ratio for forming the thallium system superconductor can be formed by conventional methods known to those skilled in the art. For example, sequential electron beam evaporation can be used to deposit the metals in layers to form a film of the desired composition. The film can be oxidized either during or subsequent to the film formation. The electron beam evaporation technique is discussed in "Superconducting Thin Films of $Tl_2Ca_2Ba_2Cu_3O_y$ and $Tl_{22}Cu_2O_y$," D. S. Ginley, et al. referenced above. A spin-coating technique for forming the precursor film is described in, "Preparation of $Tl_2Ba_2Ca_2Cu_3O_y$ thick films from Ba-Ca-Cu-O films," R. Sugise, et al., Japanese Journal of Applied Physics, Vol. 27, No. 12, December, 1988, pp. L2314–L2316. Films of oxide superconductors have also been prepared using a spray pyrolysis technique based on the pyrolysis of an ultrasonic-generated aerosol containing the precursor cations. A spray pyrolysis method of forming precursor films is disclosed in "High $T_c$ Superconducting Films Prepared by Pyrolysis of an Ultrasonic-Generated Aerosol," M. Langlet et al., Journal of the Less-Common Metals, Vol. 151 (1989) pp. 399–406. Additional information about thallium system superconductor compositions and methods of preparation can be found in U.S. Pat. Nos. 5,073,536, and 4,870,052.

A preferred method for forming the precursor oxide film comprises spraying an aqueous solution of calcium, barium, copper, and silver nitrates onto a substrate of yttrium-stabilized zirconia. The substrate can be held on a heater block at about 275° C.

After deposition is complete, the temperature is increased to about 650° C. and held for about 5 minutes, then cooled. The precursor film is then heated to 845° C. in oxygen to complete the transformation from nitrates to the oxides of calcium, barium, and copper, and silver metal.

Silver-containing precursor oxide films can be formed on substrates which are resistant to chemical reaction with the precursor film such as the metals silver, gold, platinum, palladium, or alloys of the metals; and ceramics lanthanum aluminate, strontium titanate, magnesium oxide, and yttria stabilized zirconia. Bulk forms of the superconductor for use as substrates, such as flat sheets, pellets, or rods, can be prepared by solid state reaction of powders by methods known in the art.

The method of this invention provides a partial pressure of thallous oxide over the precursor deposit, while the precursor deposit is heated to a temperature at which the thallium system superconductor forms in the presence of silver. The incorporation of thallium in the precursor deposit during the formation of the superconductor provides a textured polycrystalline film structure having a high current carrying capacity which is stable at temperatures above 40° K. and in magnetic fields of 1–5 Tesla.

A two-zone flow type reactor suitable for practice of the process of this invention is shown in FIG. 1.

Referring now to FIG. 1, reactor 2 comprises an outer quartz chamber 3 and an inner reaction tube 4. The inner reaction tube can be constructed of alumina. Tubes 3 and 4 are each provided with gas inlet tubes 8 and 10, respectively, and chamber 3 has a gas outlet 12. Inside the reaction tube 4, the thallium source container 16 and precursor deposit tray 14 are spaced apart with the thallium source tray located in the vaporization zone nearer the gas inlet 10 end and the precursor tray in the reaction zone nearer the gas outlet 12 end of the reaction tube 4.

Reactor 2 is placed within a two zone furnace 18 which is provided with controls to vary and maintain the temperature in the zones at the operating temperatures.

In operation, an oxygen flow is maintained through both the quartz chamber and the reactor tube. The temperature of the thallium source boat is held at about 690° C. until the temperature of the precursor deposit stabilizes at about 860° C. at which point the thallium source temperature is increased to about 730° C.

Figure 2:
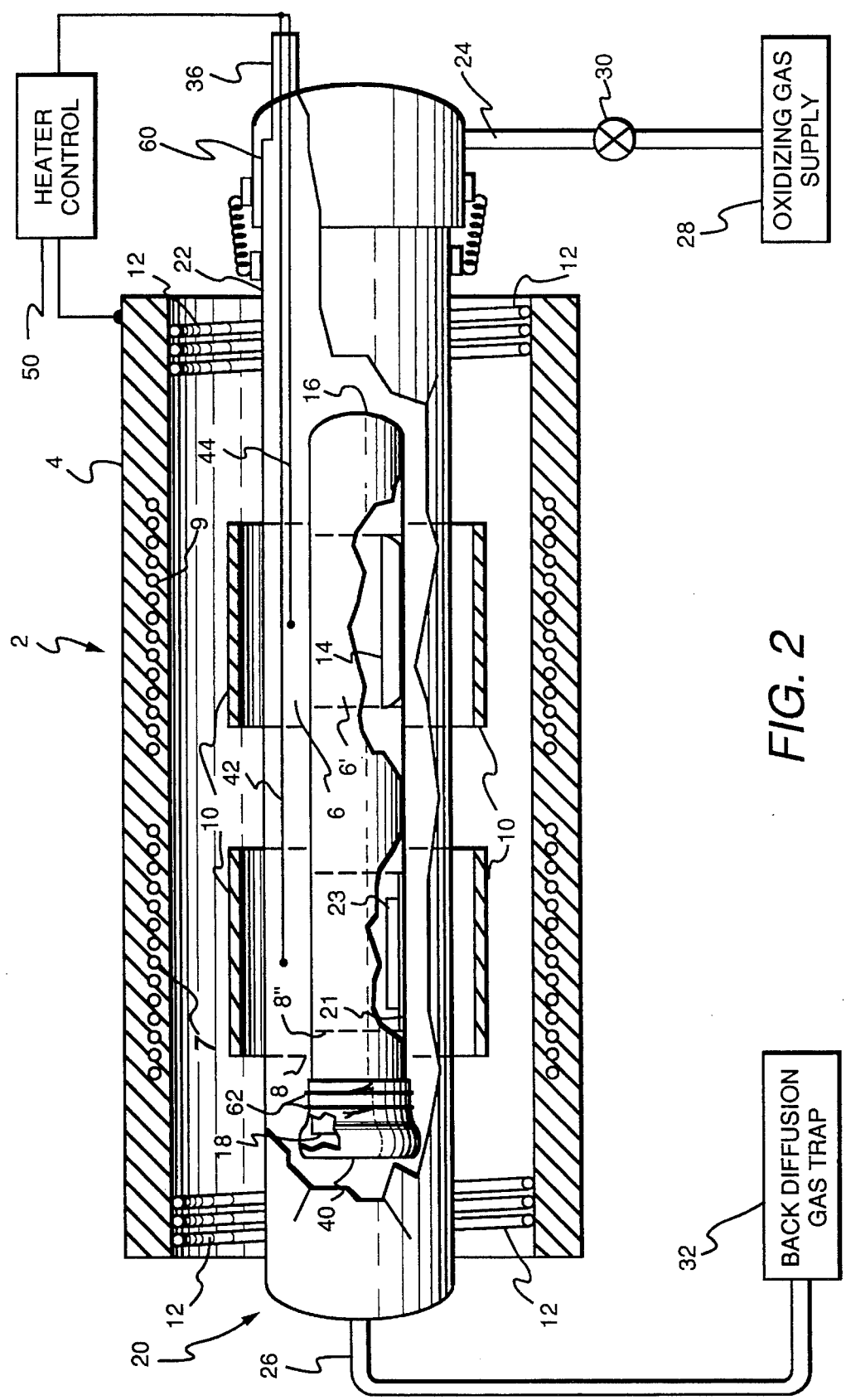
FIG. 2 is a sectional view of a side elevation of a static reactor apparatus used in the method of this invention.

A static reactor suitable for the practice of the invention is shown in FIG. 2. The reactor 2 comprises an annular two zone furnace 4 having a first heating zone 6 and a separate second heating zone 8. A suitable multizone furnace would be the series 31102 furnace from Applied Test Systems, Inc., about 41 cm in length and 30 cm in diameter. Resistance heating coils 7 and 9 surround heating zone 6 and 8 respectively, and provide the heat source for each zone. Resistance heating coils 7 and 9 are made, for example, from NICHROME resistance wire. Annular shields 10 approximately 10 cm in length and 3 cm in diameter are located within heating zones 6 and 8, and axially to furnace 4. The shields serve as heat pipes that evenly distribute the heat from resistance heating coils 7 and 9 within each heating zone. Heat shields 10 can be made from a heat resistant alloy, for example high nickel and chromium stainless steels having a minimum chromium plus nickel content of about 20 weight percent. At each end of furnace 4 are auxiliary resistance coil heaters 12. The auxiliary heaters reduce the temperature gradient between the heating zones and the atmosphere outside furnace 4. In this way, the temperature within at least a central portion of about 4 cm of each heating zone can be controlled to within about plus or minus 2° C.

Axially located within annular multizoned furnace 4 is a reactor assembly 20. Reactor assembly 20 is comprised of a combustion chamber 22 having atmosphere inlet 24 and atmosphere outlet 26. Combustion chamber 22 is made from a material suitable for containing an oxidizing atmosphere at elevated temperatures up to about 950° C, for example, a quartz tube of about 100 cm in length by 2.5 cm in diameter. The combustion chamber is slidably located in furnace 4, extending through heat shields 10. Inlet 24 is connected to an oxidizing gas supply 28 that is controlled by valve 30. Outlet 26 is connected to a back diffusion gas trap 32. A suitable trap 32 is a silicon oil gas bubbler comprised of a flexible tube connected to outlet 26 that extends into an open container partially filled with silicon oil. Gas passing through the tube is bubbled through the oil before passing into the atmosphere so that the ambient atmosphere cannot diffuse backwards through the tube into combustion chamber 22.

A reaction vessel 16 is located within combustion chamber 22, and is made from a material resistant to chemical attack from thallous oxide such as fused alumina, gold, or zirconia, and is suitable for containing an oxidizing atmosphere. Reaction vessel 16 is located within combustion chamber 22 so that a first zone 6' within reaction vessel 16 is approximately centrally located within heating zone 6 of tubular furnace 4, and a separate second zone 8' within reaction vessel 16 is approximately centrally located within heating zone 8 of tubular furnace 4. Reaction vessel 22 can be formed, for example, from a fused alumina tube about 25 cm long by 1.25 centimeters in diameter, having one open end 18.

A holder 14 is made from a material chemically inert to attack from thallous oxide, such as gold, and is used to hold a source of thallous oxide. A suitable source of thallous oxide is, for example, thallic oxide, thallous oxide, or oxide compounds of thallium. The source of thallous oxide is placed within holder 14, for example a deposit of 1 gram of thallic oxide is suitable for several annealing procedures for small samples of precursor films. A tray 21 is made from one of the materials chemically resistant to attack from thallous oxide. Substrate 23, having the precursor film deposited thereon, is placed on tray 21.

Reaction vessel 16 is prepared for use in the method of this invention, by first placing the thallous oxide in holder 14 within first zone 6' and the precursor film on substrate 23 on tray 21 within second zone 8' of reaction vessel 16, and sealing an oxidizing atmosphere within reaction vessel 16. A suitable procedure for sealing an oxidizing atmosphere within reaction vessel 16 comprises placing the reaction vessel within a gas impermeable container having one open end, such as a plastic bag, and loosely placing a cap 40 over the open end 18 of reaction vessel 16. Cap 40 is made from material resistant to chemical attack from thallous oxide such as silver foil. A tubular cylinder, having a larger diameter than reaction vessel 16, is placed in the bag and reaction vessel 16 is positioned within the cylinder so that the cap is inside the cylinder. The open end of the bag is then sealed around a tube that is alternately connected to a vacuum and then a source of oxidizing gas. The cylinder prevents the bag from collapsing over the open end of the reaction vessel during evacuation.

The container is evacuated, and backfilled with an oxidizing atmosphere several times to establish the desired oxidizing atmosphere within reaction vessel 16. A flow of the oxidizing gas is maintained in the container while a slit is made in the container near the cap. One or two wire loops are passed through the slit and placed around the portion of cap 40 that extends over reaction vessel 16, and the ends of the wire loops are twisted together so that the wire loops 62 seal the cap over the open end 18 of reaction vessel 16.

Combustion chamber 22 is opened and closed at ground glass joint 60. Thermocouples 42 and 44 are positioned within combustion chamber 22 to measure the temperature in first vessel zone 6' and second vessel zone 8' respectively. A conventional heater control means 50 controls the temperature of heating coils 7 and 9. Thermocouples 42 and 44 enter combustion chamber 22 through seal 36, and are positioned so that the temperature sensing ends of the thermocouples are centrally located in first zone 6 and second zone 8 respectively.

Combustion chamber 22 is opened at ground glass joint 60, and reaction vessel 16 is placed within combustion chamber 22 so that first vessel zone 6' and second vessel zone 8' are centrally located within heating zones 6 and 8 respectively. Combustion chamber 22 is closed and sealed at ground glass joint 60. Valve 30 is opened and chamber 22 is flushed with the oxidizing atmosphere within reaction vessel 16 so that the oxidizing atmosphere previously sealed within vessel 16 is maintained.

Heater control 50 is activated to heat zones 6 and 8. First vessel zone 6' is heated to a first temperature, for example to a temperature of about 730°–800° C., selected to incorporate thallium into the precursor film in an amount of about 6 to 22 mole percent of the total metals in the superconducting film. Second vessel zone 8', and the precursor film, are heated to a second temperature that forms the thallium system superconductor, for example about 855°–890° C., preferably about 855°–860° C. For example, the $TlCa_2Ba_2Cu_3O_{8.5+y}$ thallium system superconductor comprised of about 5 mole percent silver is formed by incorporating about 6 to 12 mole percent, preferably, about 9 mole percent thallium based upon the total moles of metals in the superconducting film. In another example, the $Tl_2Ca_2Ba_2Cu_3O_{10+y}$ thallium system superconductor comprised of about 5 mole percent silver is formed by incorporating about 12 to 22 mole percent, preferably, about 16 mole percent thallium based upon the total moles of metals in the superconducting film.

The heating rate of first vessel zone 6' is controlled so that the first temperature is reached after the precursor film has been heated in second vessel zone 8' to the second temperature where the polycrystalline thallium system superconductor forms. For example, the first vessel zone 6' is heated to about 40° C. below the first temperature, and when second vessel zone 8' has been heated to the second temperature, first vessel zone 6' is heated to the first temperature. If first zone 6' is heated to the first temperature before the second zone 8' is heated to the second temperature, an excessive amount of thallium can be incorporated in the film. In other words, the heating rates in zones 6' and 8' are selected so that the amount of thallium incorporated into the film, at any time during the annealing process, does not exceed the desired final amount. The resulting 1223 superconducting film has a high current carrying capacity and high magnetic field behavior.

The precursor film is heated for a period of time in which the superconducting phase forms but before there is significant reaction with the substrate. Preferably, the precursor film is heated for about 10 to 60 minutes. Barrier layers, for example, of barium aluminate or barium zirconate deposited on the substrates prior to depositing the precursor film help minimize interaction between the film and substrate during heating. The use of such barrier layers would allow increased time periods for annealing in which reaction between the precursor film and substrate is minimized. After annealing is complete, the combustion chamber is allowed to cool in the furnace with the oxidizing atmosphere flowing through combustion chamber 22.

The superconducting film can be postannealed in an oxidizing atmosphere at about 500°– 650° C., preferably about 500°–600° C. to provide further improvement in the current carrying capacity of the superconductor.

EXAMPLE 1

Precursor films of the silver-containing precursor oxides were formed on single crystal and polycrystalline yttria stabilized zirconia substrate chips about 8×12.5×0.5 mm by the spray pyrolysis technique. Briefly described, a metal nitrate solution was formed by dissolving about 5 mole percent silver, based upon the total metals in the precursor film, and Cu, $CaCO_3$, and $BaCO_3$ in the ratios for forming thallium system superconductors having the composition of about $Tl_xCa_2Ba_2Cu_3O_{10+y}$ in a nitric acid solution. The substrate chips were cleaned by ultrasonic agitation in trichlorethylene, followed by ultrasonic agitation in acetone, followed by rinsing in methanol and blowing dry. The cleaned substrate chips were mounted on a heating block and heated to about 275° C. The nitrate solution was ultrasonically nebulized and sprayed onto a substrate chip to form a 3 to 5 micron coating of the metal nitrates. The coated substrate was heated to about 650° C. to pyrolyze the precursor film, decomposing the nitrates and oxidizing the film. The substrate chips were cooled, removed from the heater block, transferred to a combustion tube furnace at 500° C., and heated to about 845° C. in oxygen in about 30 minutes. The films were cooled in the oxygen atmosphere and stored in a desiccator. The final precursor film samples were about 2 to 4 microns thick.

Figure 3:
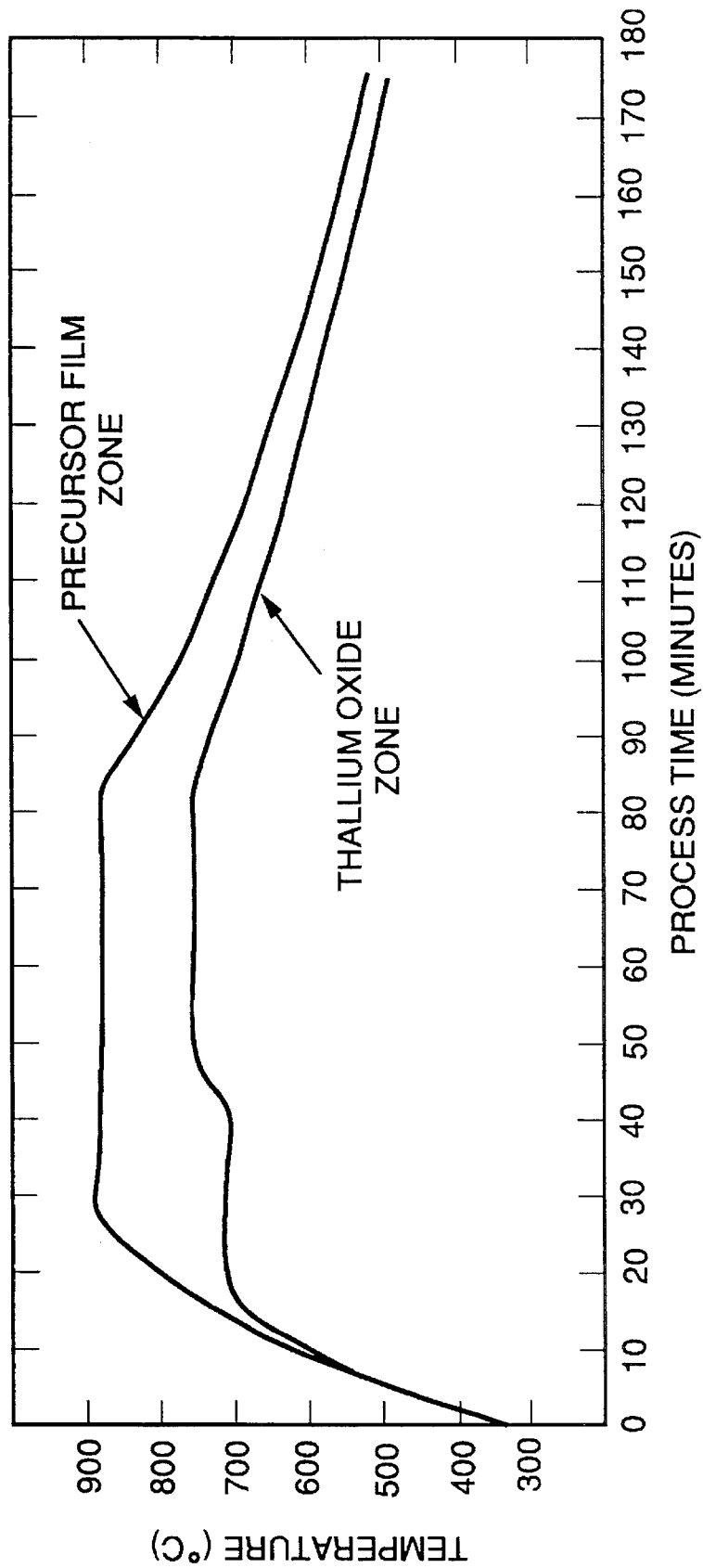
FIG. 3 is a graph showing the temperature versus time for annealing a precursor film with a thallic oxide sample by the method of this invention to form a thallium system superconductor.

The precursor film samples were annealed by the method of this invention to form polycrystalline $Tl_xCa_2Ba_2Cu_3O_{10+y}$ superconductive films where x varies from about 1.3 to 2, and y is a fraction of one, or polycrystalline $Tl_xCa_2Ba_2Cu_3O_{8.5+y}$ superconductive films where x varies from about 0.7 to 1 and y is a fraction of one. Precursor film samples were heated in the reaction vessel in an oxygen atmosphere to temperatures of about 855°–860° C. while at the same time heating a sample of thallic oxide to various temperatures between 720° C. to 800° C., and holding at thirty minutes. An example of the heating schedule for the thallic oxide and precursor film is shown in FIG. 3. FIG. 3 is a graph of the temperature versus time recorded during annealing of a precursor film in zone 2 with a piece of thallic oxide in zone 1 of the apparatus of FIG. 2. The films were furnace cooled to 500° C., cooled at about 20° C. per minute to 100° C., and removed from the combustion chamber. The superconducting films were given a post-anneal in an oxygen atmosphere at about 600° C. for 8 hours.

The thallium content in the annealed films was determined from the weight gain in the samples after the anneal. A technique well known in the art as four point probe DC measurement was performed at various temperatures to measure the critical temperature, $T_c$, in the films. Film samples were patterned with a bridge structure about 0.4 millimeter long and 100 microns wide by a standard mask and chemical etch process for measuring the critical current, $J_c$, in the film. The processing temperatures, thallium content, critical current, and critical temperature of some of the superconducting film samples are shown below in Table II.

TABLE II

| Sample No. | Tl Temp. (°C.) | Film Temp. (°C.) | $Tl_x$ | $T_c$ (K) | $(J_c$ A/cm$^2$) |
| --- | --- | --- | --- | --- | --- |
| 1 | 735–750 | 855–860 | 0.70 | 107 | 62,000 |
| 2 | 735–750 | 855–860 | 1.00 | 107 | 13,300 |
| 3 | 735–750 | 855–860 | 0.70 | 106 | 23,900 |
| 4 | 735–750 | 855–860 | 0.80 | 105 | 21,000 |
| 5 | 735–750 | 855–860 | 0.75 | 104 | 105,000 |
| 6 | 735–750 | 855–860 | 0.70 | 105 | 12,600 |
| 7 | 735–750 | 855–860 | 0.75 | 105 | 18,800 |
| 8 | 735–750 | 855–860 | 0.75 | 105 | 8,800 |
| 9 | 735–750 | 855–860 | 0.80 | 104 | 22,000 |
| 10 | 735–750 | 855–860 | 0.75 | 105 | 42,000 |
| 11 | 750–800 | 855–860 | 1.35 | 115 | 12,700 |
| 12 | 750–800 | 855–860 | 1.33 | 112 | 10,100 |

The critical current of a number of the superconducting film samples was measured before and after the post-annealing treatment, and are shown below in Table III.

TABLE III

| Sample No. | $J_c$ (A/cm$^2$) | After Post-Annealing $J_c$ (A/cm$^2$) |
| --- | --- | --- |
| 13 | 14,000 | 30,500 |
| 14 | 350 | 1,500 |
| 15 | 2,300 | 7,000 |
| 16 | 3,800 | 10,300 |
| 17 | 3,400 | 7,500 |
| 18 | 19,000 | 62,000 |
| 19 | 3,700 | 6,700 |
| 20 | 6,900 | 12,700 |
| 21 | 1,250 | 1,800 |
| 22 | 8,100 | 14,200 |
| 23 | 5,900 | 10,200 |
| 24 | 1,100 | 3,300 |
| 25 | 350 | 1,055 |

X-ray diffraction patterns of the samples were obtained on a Siemens D500 diffractometer using copper K-alpha radiation. An incident beam collimator was employed to restrict the X-ray beam to the surface of the sample. The X-ray diffraction patterns showed the presence of a well crystallized $Tl_xCa_2Ba_2Cu_3O_{8.5+y}$ phase where x is between about 0.7 to 1, or $Tl_xCa_2Ba_2Cu_3O_{10+y}$ phase where x is between about 1.3 to 1.6, with only a trace of the $Tl_2CaBa_2Cu_2O_{8+x}$ phase. The relative peak intensities of the patterns showed that the C-axis of the unit cell of the primary phase was oriented perpendicular to the substrate surface, with a high degree of alignment of the $Tl_xCa_2Ba_2Cu_3O_{8.5+y}$ or $Tl_xCa_2Ba_2Cu_3O_{10+y}$ phase.

Scanning electron microscope micrographs were obtained using a Hitachi S-800 field emission scanning electron microscope. The sample microstructures consist of plate-like grains elongated in the direction parallel to the substrate.

The thallium content of samples 1 and 3-10 was determined to be significantly less than that expected for the stoichiometric composition of the $Tl_1Ca_2Ba_2Cu_3O_{8.5+y}$ film. The thallium content of sample films 11, and 12 was found to be significantly less than that expected for the formation of stoichiometric $Tl_2Ca_2Ba_2Cu_3O_{10+y}$.

Figure 4:
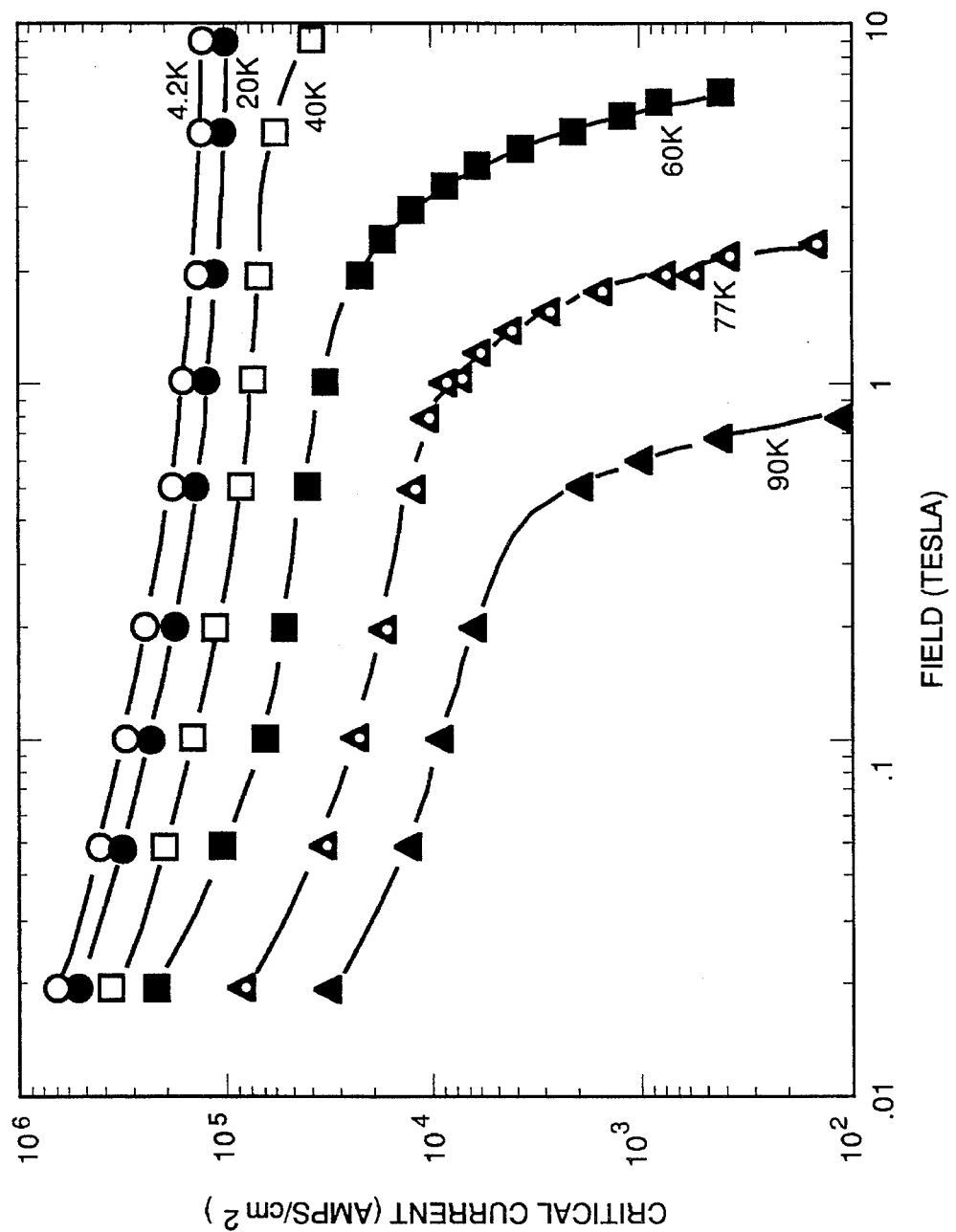
FIG. 4 is a graph showing the current density, measured in a perpendicular magnetic field at various intensities, in a thallium system superconducting film formed by the method of this invention.

The magnetic field dependence of the current carrying capacity of sample 5 was measured between about 4.2 to 90 Kelvin. The superconducting film of sample 5 was placed in a magnetic field that was perpendicular to the direction of current flow in the film, and was varied from 0 up to about 10 tesla while the current density in the film was measured. The current density versus applied magnetic field is shown in FIG. 4. Even under this most severe condition of magnetic field, the film exceeded 100,000 A/cm$^2$ at 20° K. out to fields of 10 tesla. It is believed this is the highest magnetic field behavior ever measured up to that time in a polycrystalline thick film $Tl_1Ca_2Ba_2Cu_3O_{8.5+y}$ superconductor.

The Examples above were made with a precursor film containing silver, and formed by spray pyrolysis. Depending upon the initial form of the precursor film or deposit, the processing conditions for forming the thallium system superconductor having strong current links between grains may vary. For example, the densely formed highly reactive films formed by sequential electron beam evaporation are expected to form the superconductor at temperatures similar to the annealing temperatures in the Examples. However, silver containing precursor oxide films prepared by any of the deposition techniques can be converted to thallium system superconducting films with properties comparable to those of the films prepared by the annealing processes of this invention. The processing conditions required will depend upon the composition of the precursor oxide film, and the film deposition process. By a few simple experiments, as in the Examples above, using the method of this invention, the annealing temperature ranges in the zones for the source of thallous oxide and the superconducting precursor can be determined for forming the precursor films or deposits into the thallium system superconductor having strong current links between the grains.

EXAMPLE 2

Precursor oxide film samples having the cation stoichiometry $Ca_2Ba_2Cu_3Ag_{0.37}$ were prepared by spraying an aqueous solution of metal nitrates onto a substrate held on a heating block at about 275° C. The amount of material deposited was selected to provide a superconducting film of about 3 μm thickness. The precursor oxide deposited was converted to superconducting 1223 thallium system film in a reactor as described in FIG. 1 by the so called 2-step thallination process. In this process, the precursor oxide film sample is placed in the reaction zone of the 2-zone reactor in an oxygen-containing atmosphere having a partial pressure of thallous oxide. The thallous oxide is generated from a supply of thallic oxide in the vaporization zone of the two zone reactor. The furnace is controlled to heat the vaporization zone to 690° C. and hold there until the reaction zone and the precursor oxides reach 860° C. at which time the temperature of the thallic oxide in the vaporization zone is raised to and maintained at about 730° C. After about 30 minutes, the furnace is turned off and the system allowed to cool.

A series of samples each one of which had been brought to a different point in the process and then quenched by moving the reactor tube assembly to a position outside of the furnace. Samples were examined by X-ray diffraction, scanning electron microscopy equipped with energy dispersive spectroscopy, and transmission electron microscopy.

In summary, the evolution of the microstructure indicates thallium oxide is incorporated into the film and growth of the highly oriented "1223" phase occurs only after the thallium oxide boat temperature is raised to ~730° C. We have found that the thallium oxide is not incorporated in a uniform manner. Rather, it enters the film at isolated sites. Our analysis indicates that at these sites, a liquid phase forms from which the "1223" phase grows. As more thallium oxide is incorporated, these sites grow in size until the entire sample is converted to the "1223" phase. The data indicates that, although the thallium incorporation occurs at sites in areas that are predominantly calcium oxide, barium and copper oxides, and silver must also be present. We have found no evidence of a significant incorporation of silver into the "1223" phase. Rather, the silver is found only as isolated nodules in the final films. Table IV below lists the segmented bridge ($J_c$(zf-77K)) values obtained on four samples prepared in a 2-step flow reactor. The $T_c$ values of the samples ranged from 104K to 107K.

TABLE IV

| | $J_c$ (zf-77K) in a A/cm$^2$ | | | |
|---|---|---|---|---|
| Sample | Segment 1 | Segment 2 | Segment 3 | Segment 4 |
| 1 | 46,000 | 67,200 | 336,000 | 148,000 |
| 2 | 166,000 | 26,800 | 16,300 | 80,500 |
| 3 | 51,700 | 10,300 | 16,800 | 41,900 |
| 4 | 31,900 | 124,000 | 97,300 | 80,500 |

The use of silver additions in the synthesis of bulk forms of the thallium system superconductors from precursor oxide powder mixtures will also provide improvements in the current links between grains. However, because of the relatively slow rate of diffusion of thallium it is unlikely that very thick samples could be prepared without the deliberate addition of thallium oxide powder to the precursor mixture.

What is claimed is:

1. A method for forming on a substrate a textured polycrystalline film of 1223 phase thallium system superconductor comprising: forming a precursor deposit on the substrate comprising oxides of calcium, barium, and copper in ratios for forming the superconductor and silver, in an amount of about 1 to 20 mole percent of total metals in the precursor deposit; and heating at a temperature between 855° to 860° C. the precursor deposit in an oxidizing atmosphere containing thallous oxide at a temperature of 735°–750° C. to form the film of the thallium system superconductor, where the oxidizing atmosphere comprises oxygen and up to 80 percent of an inert gas selected from the group consisting of nitrogen and argon, and where the silver causes a liquid phase formation of the precursor deposit that incorporates thallium into the deposit in an amount of about 6 to 22 mole percent of total metals in the deposit, and facilitates the growth Of a well-connected microstructure of the thallium system superconductor, thereby forming the textured film of the thallium system superconductor.

2. A method for forming on a substrate a textured polycrystalline film of 1223 phase thallium system oxide superconductor where crystallites of said polycrystalline film are aligned with a C-axis perpendicular to a surface of the substrate, comprising: forming a precursor film on the substrate comprising oxides of calcium, barium, and copper in ratios for forming the 1223 phase thallium system oxide superconductor, and silver, in an amount of about 1 to 20 mole percent of total metals in the precursor film; and annealing the precursor film at a temperature from 855° to 860° C. for about 10 to 60 minutes in an oxidizing atmosphere saturated with thallous oxide, where the oxidizing atmosphere comprises oxygen and up to 80 percent of an inert gas selected from the group consisting of nitrogen and argon, kith the source of thallous oxide at a temperature from 735° to 750° C., and where the silver causes a liquid phase formation of the precursor film that incorporates thallium into the film in an amount of about 6 to 12 mole percent of total metals in the film, and said silver facilitates the growth of a microstructure of the 1223 phase thallium system oxide superconductor, thereby forming the textured polycrystalline film of 1223 phase thallium system oxide superconductor.

3. A method for forming a textured film of 1223 phase thallium superconductor comprising: depositing on a substrate, a precursor film comprising nitrates of calcium, barium, and copper and an effective amount of silver nitrate; heat treating the precursor film in an oxidizing atmosphere to convert the nitrites to oxides thereby forming an oxide film comprising calcium oxide, barium oxide, copper oxide and silver; and then heating the oxide film in a thallous oxide saturated oxidizing atmosphere at a temperature between 855° to 860° C., with the source of thallous oxide at a temperature from 735° to 750° C., where the silver causes a liquid phase formation of the oxide film that incorporates thallium into the film in an amount of about 6 to 22 mole percent and said silver facilitates the growth of a microstructure of said film of 1223 phase thallium superconductor where crystallites of said 1223 thallium superconductor film are aligned with a C-axis perpendicular to a surface of the substrate to form the textured 1223 superconductor film.

4. A method for making textured thallium system 1223 superconductor film which comprises forming a precursor film on a substrate by applying to a surface of the substrate a liquid coating of an aqueous solution containing dissolved salts of calcium, barium, copper, and silver in stochiometric ratio to form the 1223 superconductor film, heating the liquid coated substrate to dry the coating; then heat treating the coated substrate in an oxidizing atmosphere to form the precursor film comprising oxides of calcium, barium, and copper, and silver metal; and then heating a precursor film in a thallous oxide saturated oxidizing atmosphere at a temperature of 855° to 860° C., with the source of thallous oxide at a temperature from 735° to 750° C. where the silver causes a liquid phase formation of the precursor film that incorporates thallium into the film in an amount of about 6 to 22 mole percent and where the silver facilitates the growth of a well-connected microstructure of the thallium system 1223 superconductor film where crystallites of the thallium system 1223 superconductor film are aligned with a C-axis perpendicular to the surface of the substrate, to form the textured 1223 superconductor film on the surface of the substrate.

5. A method according to claim 1 where the textured polycrystalline film of 1223 thallium system superconductor comprises crystallites aligned with a C-axis perpendicular to a surface of the substrate.

6. An oxide superconductor film on a substrate consisting essentially of 1223 phase according to $Tl_xCa_2Ba_2Cu_3O_{8.5+y}$ where x varies form about 0.7 to 1, and y is a fraction of 1 and having a current carrying capacity of exceeding 100,000 amps per square centimeter at a temperature less than or equal to about 20K in a magnetic field of about 10 tesla.

* * * * *